(12) United States Patent
Brewer et al.

(10) Patent No.: US 12,444,712 B1
(45) Date of Patent: *Oct. 14, 2025

(54) INTEGRATED MECHANICAL AIDS FOR HIGH ACCURACY ALIGNABLE-ELECTRICAL CONTACTS

(71) Applicant: HRL Laboratories, LLC, Malibu, CA (US)

(72) Inventors: Peter Brewer, Westlake Village, CA (US); Aurelio Lopez, Thousand Oaks, CA (US); Partia Naghibi-Mahmoudabadi, Canoga Park, CA (US); Tahir Hussain, Calabasas, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 125 days.

This patent is subject to a terminal disclaimer.

(21) Appl. No.: 18/076,364

(22) Filed: Dec. 6, 2022

Related U.S. Application Data

(63) Continuation of application No. 17/070,826, filed on Oct. 14, 2020, now Pat. No. 11,562,984.

(51) Int. Cl.
*H01L 25/065* (2023.01)
*H01L 23/00* (2006.01)
*H01L 25/00* (2006.01)

(52) U.S. Cl.
CPC .......... *H01L 25/0657* (2013.01); *H01L 24/16* (2013.01); *H01L 24/81* (2013.01);
(Continued)

(58) Field of Classification Search
CPC ................ H01L 25/0657; H01L 2225/06593
See application file for complete search history.

(56) References Cited

U.S. PATENT DOCUMENTS 3,812,559 A 5/1974 Spindt
4,912,844 A 4/1990 Parker
(Continued)

FOREIGN PATENT DOCUMENTS

EP 0 982 385 3/2000
JP 10-022338 1/1998
(Continued)

OTHER PUBLICATIONS

PCT International Preliminary Report on Patentability (Chapter II) from PCT/US2020/048553 mailed on May 6, 2021.
(Continued)

*Primary Examiner* — Dale E Page
*Assistant Examiner* — Wilner Jean Baptiste
(74) *Attorney, Agent, or Firm* — Ladas & Parry, LLP

(57) ABSTRACT

A method and apparatus for laterally urging two semiconductor chips, dies or wafers into an improved state of registration with each other, the method and apparatus employing microstructures comprising: a first microstructure disposed on a first major surface of a first one of said two semiconductor chips, dies or wafers, wherein the first microstructure includes a sidewall which is tapered thereby disposing it at an acute angle compared to a perpendicular of said first major surface, and a second microstructure disposed on a first surface of a second one of said two semiconductor chips, dies or wafers, wherein the shape of the second microstructure is complementary to, and mates with or contacts, in use, the first microstructure, the second microstructure including a surface which contacts said sidewall when the first and second microstructures are mated or being mated, the sidewall of the first microstructure and the surface of the second microstructure imparting a lateral force for urging the two semiconductor chips, dies or wafers into said improved state of registration.

20 Claims, 11 Drawing Sheets

(52) U.S. Cl.
CPC .... *H01L 25/50* (2013.01); *H01L 2224/10135* (2013.01); *H01L 2224/1607* (2013.01); *H01L 2224/16145* (2013.01); *H01L 2224/81143* (2013.01); *H01L 2224/81385* (2013.01); *H01L 2225/06513* (2013.01); *H01L 2225/06593* (2013.01)

(56) References Cited

U.S. PATENT DOCUMENTS

| | | |
|---|---|---|
| 5,032,896 A | 7/1991 | Little et al. |
| 5,055,780 A | 10/1991 | Takagi |
| 5,160,779 A | 11/1992 | Sugihara |
| 5,161,093 A | 11/1992 | Gorczyca |
| 5,284,548 A | 2/1994 | Carey |
| 5,312,765 A | 5/1994 | Kanber |
| 5,324,687 A | 6/1994 | Wojnarowski |
| 5,326,428 A | 7/1994 | Farnworth |
| 5,353,498 A | 10/1994 | Fillion |
| 5,485,038 A | 1/1996 | Licari |
| 5,489,554 A | 2/1996 | Gates |
| 5,545,291 A | 8/1996 | Smith |
| 5,609,907 A | 3/1997 | Natan |
| 5,751,018 A | 5/1998 | Alivisatos |
| 5,772,905 A | 6/1998 | Chou |
| 5,783,856 A | 7/1998 | Smith |
| 5,800,650 A | 9/1998 | Anderson |
| 5,824,186 A | 10/1998 | Smith |
| 5,861,670 A | 1/1999 | Akasaki |
| 5,877,550 A | 3/1999 | Suzuki |
| 5,904,545 A | 5/1999 | Smith |
| 6,037,255 A | 3/2000 | Hussein |
| 6,096,386 A | 8/2000 | Biebuyck |
| 6,130,823 A | 10/2000 | Lauder |
| 6,165,911 A | 12/2000 | Calveley |
| 6,294,741 B1 | 9/2001 | Cole, Jr. |
| 6,296,171 B1 | 10/2001 | Hembree |
| 6,326,058 B1 | 12/2001 | Biebuyck |
| 6,417,025 B1 | 7/2002 | Gengel |
| 6,479,395 B1 | 11/2002 | Smith |
| 6,500,694 B1 | 12/2002 | Enquist |
| 6,507,989 B1 | 1/2003 | Bowden |
| 6,541,346 B2 | 4/2003 | Malik |
| 6,579,463 B1 | 6/2003 | Winningham |
| 6,586,338 B2 | 7/2003 | Smith |
| 6,611,237 B2 | 8/2003 | Smith |
| 6,652,808 B1 | 11/2003 | Heller et al. |
| 6,656,568 B1 | 12/2003 | Winningham |
| 6,657,289 B1 | 12/2003 | Craig |
| 6,946,322 B2 | 9/2005 | Brewer |
| 7,105,376 B1 | 9/2006 | Brewer |
| 7,223,635 B1 | 5/2007 | Brewer |
| 7,622,813 B2 | 11/2009 | Brewer |
| 9,852,988 B2* | 12/2017 | Enquist ............ H01L 21/76838 |
| 10,458,020 B2* | 10/2019 | Ishii ................. C23C 16/52 |
| 11,540,399 B1* | 12/2022 | Brewer ............. H05K 3/3431 |
| 11,555,830 B2 | 1/2023 | Daniel |
| 11,562,984 B1* | 1/2023 | Brewer ............. H01L 24/16 |
| 2001/0010743 A1* | 8/2001 | Cayrefourcq ......... G02B 6/4232 |
| | | 257/E21.705 |
| 2002/0005294 A1 | 1/2002 | Mayer |
| 2002/0019068 A1 | 2/2002 | Ericson |
| 2002/0045030 A1 | 4/2002 | Ozin |
| 2003/0062123 A1 | 4/2003 | Hunter |
| 2003/0068519 A1 | 4/2003 | Brewer |
| 2003/0112576 A1 | 6/2003 | Brewer |
| 2003/0140317 A1 | 7/2003 | Brewer |
| 2004/0016998 A1 | 1/2004 | Fonstad |
| 2004/0142575 A1* | 7/2004 | Brewer ............. H01L 25/0655 |
| | | 257/E21.705 |
| 2007/0077677 A1* | 4/2007 | Haba ................. H01L 21/563 |
| | | 438/51 |
| 2007/0132097 A1 | 6/2007 | Wark |
| 2012/0137512 A1* | 6/2012 | Di Stefano ......... G01R 31/2867 |
| | | 29/825 |
| 2013/0106453 A1 | 5/2013 | Ikegami |
| 2016/0084882 A1 | 3/2016 | Dang |
| 2017/0010315 A1 | 1/2017 | Hironaka |

FOREIGN PATENT DOCUMENTS

| | | |
|---|---|---|
| WO | 01/33300 | 5/2001 |
| WO | 2010-141264 A1 | 12/2010 |

OTHER PUBLICATIONS

PCT International Search Report and Written Opinion from PCT/US2020/048553 mailed on Dec. 4, 2020.

Anderson, et al., "Technique for Connecting Electrical Leads to Semiconductors" Journal of Applied Physics 28, 923 (1957), pp. 923-924.

Bains, S., "Circuit Blocks Attached Via DNA," Electronic Engineering Times, pp. 39 and 44 (Mar. 9, 1998).

Bains, S., "Double Helix Doubles as Engineer," Science, vol. 279, pp. 2043-2044 (Mar. 27, 1998).

Bobbio, S.M., et al., "Integrated Force Arrays," IEEE Proceedings of the Workshop on Micro Electro Mechanical Systems (MEMS), Fort Lauderdale, pp. 149-154 (Feb. 7-10, 1993).

Bohringer, K.F., et al., "Modeling of Capillary Forces and Binding Sites for Fluidic Self-Assembly," MEMS: 2001: The 14th IEEE International Conference on Micro Electro Mechanical Systems, pp. 369-374 (2001).

Borzenko, T., et al., "Polymer Bonding Process for Nanolithography," Applied Physics Letters, vol. 79, No. 14, pp. 2246-2248 (Oct. 1, 2001).

Chou, S.Y., et al., "Imprint of Sub-25 nm Vias and Trenches in Polymers," Appl. Phys. Lett., vol. 67, No. 21, pp. 3114-3116 (Nov. 20, 1995).

Chou, S.Y., et al., "Nanoimprint Lithography," J. Vac. Sci. Technol. B, vol. 14, No. 6, pp. 4129-4133 (Nov./Dec. 1996).

Cohn, M.B., et al., "Microassembly Tehnologies for MEMS," SPIE Micromachining and Microfabrication, Conference on Micromachining and Microfabrication Process Technology IV, Santa Clara, CA, 15 pages total (Sep. 21-22, 1998).

Coucoulas, et al., "Compliant Bonding—A New Technique for Joining Microelectronic Components", IEEE Transactions on Electron Devices, vol. 15, No. 9, Sep. 1968, pp. 664-674.

Gracias, D.H., "Forming Electrical Networks in Three Dimensions by Self-Assembly," Science, vol. 289, pp. 1170-1172 (Aug. 18, 2000).

Hadley, M.A., "Vertical-Cavity Surface-Emitting Laser Diodes: Design, Growth, Mode Control and Integration by Fluidic Self-Assembly," UMI Dissertation Services, Sections 5.4, 5.5, and 5.6, pp. 75-81 (1994).

Hao, E., et al., "Buildup of Polymer/Au Nanoparticle Multilayer Thin Films Based on Hydrogen Bonding," Chem. Mater., vol. 12, No. 11, pp. 3392-3396 (2000).

IBM Technical Disclosure Bulletin, "Method to Control the Geometry and Vertical Profile of Via Holes in Substrate Materials," vol. 35, No. 5, pp. 211-216 (Oct. 1992).

IBM Technical Disclosure Bulletin, "Use of High Precision Silicon Molds for Replicating Microelectronic Packaging Structures," vol. 30, No. 5, pp. 306-311 (Oct. 1987).

Kumar, A., et al., "Pattering Self-Assembled Monolayers: Applications in Materials Science," Langmuir, vol. 10, No. 5, pp. 1498-1511 (1994).

Saitou, K., et al., "Externally Resonated Linear Microvibromotor for Microassembly," Journal of Microelectromechanical Systems, vol. 9, No. 3, pp. 336-346 (Sep. 2000).

Srinivasan, U., et al., "Fluidic Self-Assembly of Micromirrors onto Surface Micromachined Actuators, " IEEE, pp. 59-60, (2000).

Srinivasan, U., et al., "Microstructure to Substrate Self-Assembly Using Capillary Forces," Journal of Microelectromechanical Systems, vol. 10, No. 1, pp. 17-24 (Mar. 2001).

Terfort, A., et al., "Self-Assembly of an Operating Electrical Circuit Based on Shape Complementarity and the Hydrophobic Effect," Advanced Materials, vol. 10, No. 6, pp. 470-473, (1998).

(56) References Cited

OTHER PUBLICATIONS

Terfort, A., et al., "Three-dimensional Self-Assembly of Millimetre-Scale Components," Letters to Nature, vol. 386, pp. 162-164 (Mar. 13, 1997).
Tormen, M., et al., "Thermocurable Polymers as Resists for Imprint Lithography," Electronics Letters, vol. 36, No. 11, pp. 983-984 (May 25, 2000).
Zhang, W., et al., "Multilevel Nanoimprint Lithography with Submicron Alignment Over 4 in. Si Wafers," Applied Physics Letters, vol. 79, No. 6, pp. 845-847 (Aug. 6, 2001).
"Image Reversal Resists and their Processing" (available at https://www.microchemicals.com/technical_information/image_reversal_resists.pdf), viewed Nov. 9, 2020.
"Probe Card" by MJC Micronics Japan Co., Ltd. (available at www.mjc.co.jp/en/products/semiconductor/probe_card.html), printed Nov. 9, 2020.
"Pyramid Probe Cards" by Cascade Microtech (available at www.cascademicrotech.com/files/PYRPROBE_APP.PDF), 2004.
"TPEG™ MEMS T4—Power Your Device" by Technoprobe (available at www.technoprobe.com/soluzione/tpeg-mems-t4-power-your-device), viewed Nov. 9, 2020.
"Vx-MP" by FormFactor (available at www.formfactor.com/product/probe-cards/foundry-logic/vx-mp/), viewed Nov. 9, 2020.

From U.S. Appl. No. 10/888,169 (now U.S. Pat. No. 7,223,635), Notice of Allowance mailed on Jan. 16, 2017.
From U.S. Appl. No. 10/888,169 (now U.S. Pat. No. 7,223,635), office action mailed on Sep. 18, 2006.
From U.S. Appl. No. 10/888,169 (now U.S. Pat. No. 7,223,635), office action mailed on Mar. 22, 2006.
From U.S. Appl. No. 10/888,169 (now U.S. Pat. No. 7,223,635), office action mailed on Jan. 12, 2006.
From U.S. Appl. No. 11/789,233 (now U.S. Pat. No. 7,622,813), Notice of Allowance mailed on Aug. 25, 2009.
From U.S. Appl. No. 11/789,233 (now U.S. Pat. No. 7,622,813), Notice of Allowance mailed on Jul. 17, 2009.
From U.S. Appl. No. 11/789,233 (now U.S. Pat. No. 7,622,813), office action mailed on Mar. 5, 2009.
From U.S. Appl. No. 17/006,491 (now U.S. Pat. No. 11,555,830), Office Action mailed on Dec. 10, 2021.
From U.S. Appl. No. 17/006,491 (now U.S. Pat. No. 11,555,830), Office Action mailed on Jun. 10, 2022.
From U.S. Appl. No. 17/006,491 (now U.S. Pat. No. 11,555,830), Notice of Allowance mailed on Sep. 21, 2022.
From U.S. Appl. No. 17/070,826 (now U.S. Pat. No. 11,562,984), Office Action mailed on Apr. 13, 2022.
From U.S. Appl. No. 17/070,826 (now U.S. Pat. No. 11,562,984), Notice of Allowance mailed on Sep. 8, 2022.

* cited by examiner

This figure shows an example of distributing partial integrated alignable contact structures across a 4-element pad array (2x2). The alignment structures on the top and bottom chips complement one another. The partial structures control the +x, -x, +y, and -y direction shifts separately.

Chips, dies or wafers with pin type microstructures

Chips, dies or wafers with sleeve type microstructures

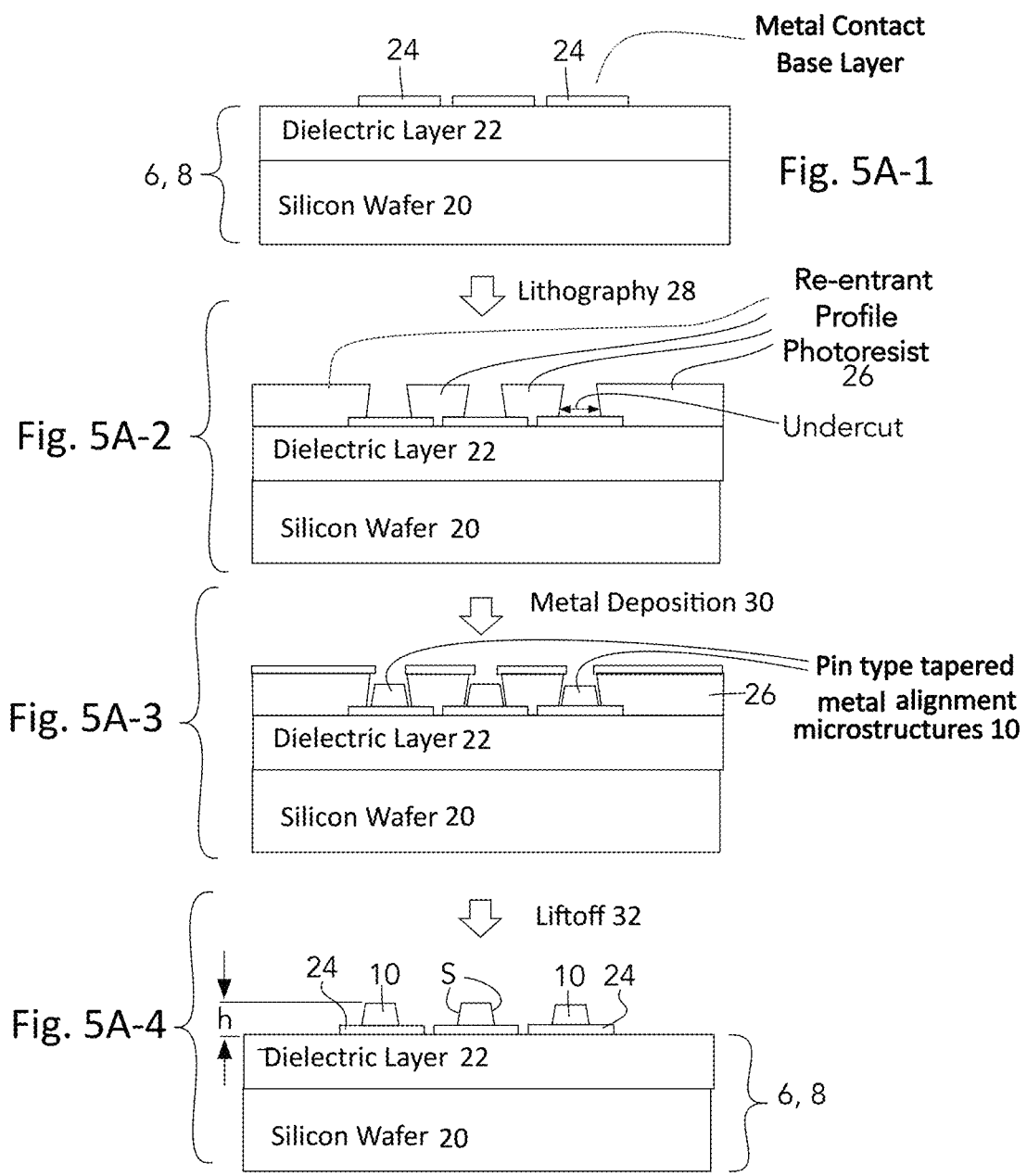

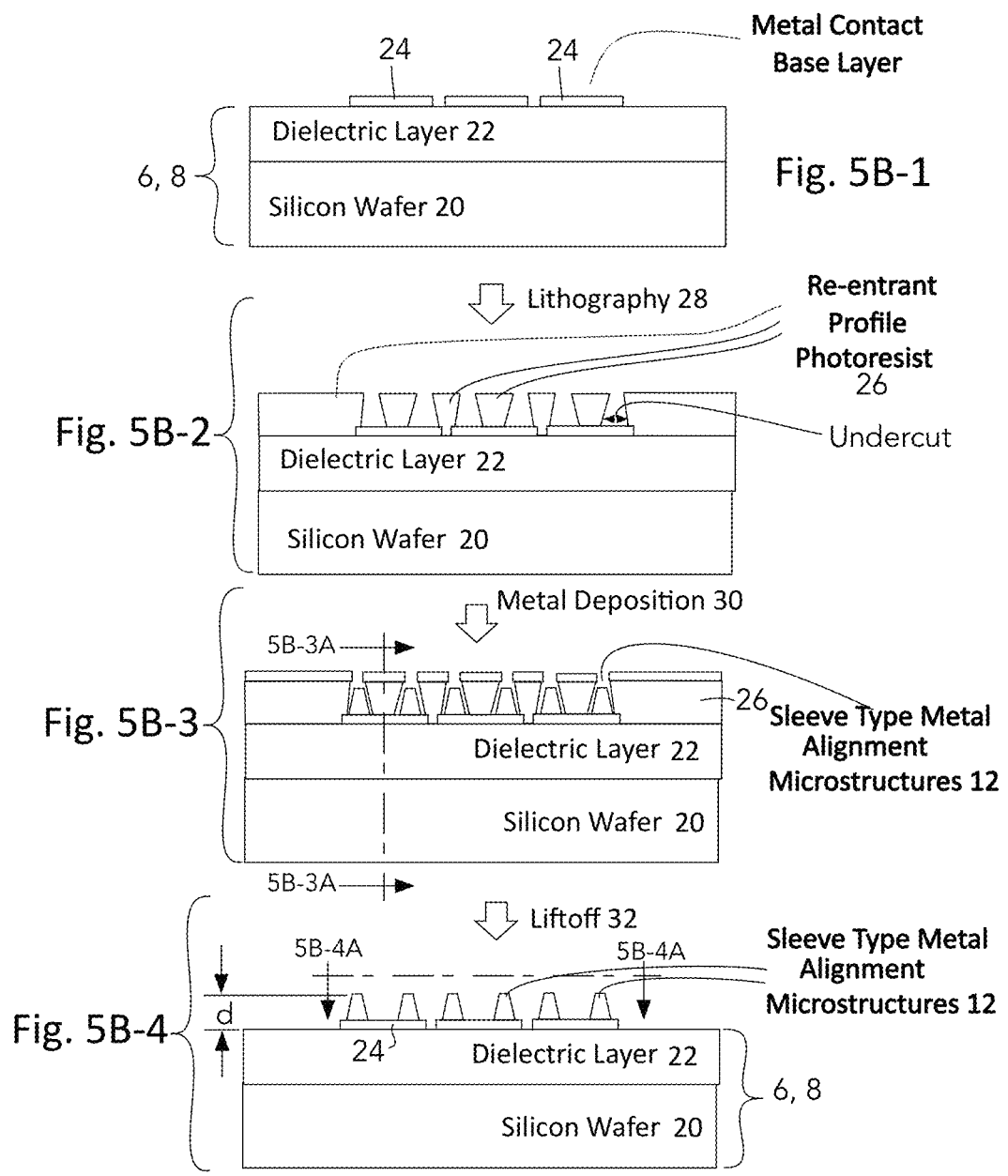

INTEGRATED MECHANICAL AIDS FOR HIGH ACCURACY ALIGNABLE-ELECTRICAL CONTACTS

CROSS REFERENCE TO RELATED APPLICATIONS

This application is a continuation of U.S. Ser. No. 17/070,826 filed 14 Oct. 2020, the disclosure of which is hereby incorporated herein by reference.

The technology disclosed herein is related to that disclosed by U.S. Pat. Nos. 7,223,635 and 7,622,813, the disclosures of which are hereby incorporated herein by reference.

The technology disclosed herein is also related to that disclosed by U.S. Provisional Patent Application No. 62/893,650 filed on 29 Aug. 2019 and entitled "Small Pitch Integrated Knife Edge Temporary Bonding Microstructures", the disclosure of which is also hereby incorporated herein by reference.

STATEMENT REGARDING FEDERALLY SPONSORED RESEARCH OR DEVELOPMENT

This invention was made with United States Government support. The United States Government has certain rights in this invention.

TECHNICAL FIELD

A method and devices for improving the alignment accuracy between 3D-stacked components such as an Integrated Circuit (IC) dies, semiconductor tiles, and wafers.

BACKGROUND

There is a growing trend in the semiconductor and packaging industries toward three-dimensional (3D) integration to address the increasing demand for higher bandwidth between ICs at low power (shorter traces, decreased parasitics), the heterogeneous integration of diverse semiconductor technologies (i.e. device level integration, for example, the integration of III-V dies or wafers with Silicon CMOS dies or wafers), and the dense integration of silicon ICs to increase performance while reducing device real-estate and costs. With typical CMOS IC line and space dimensions in the 1-micron range, high accuracy alignment capability is required in the stack to complement these dimensions and gain the full density advantage of integrating stacks of ICs.

There are few mature commercially available methods for 3D integration of integrated circuits and none that provide the requisite alignment accuracy to match to the fine pitch dimensions of current IC technologies. Existing technologies for chip-to-chip integration have significant deficiencies. These technologies include: thru-silicon-vias (TSVs) which is mature but limited to coarse pitches ~50 µm, tiered wire bonding that only provides peripheral connections and has significant electrical integrity issues, and 2.5D (side-by-side) solutions that utilize interposers or multi-chip organic packages with long routes. More aggressive 3D integration technologies are in development (i.e., direct bond integration (DBI)) but are not mature or are not readily available.

The purpose of the technology disclosed herein is to provide improved alignment capability for stacking ICs over that of state-of-the-art die bonders and other assembly tools. This invention provides the following possible advantages:

i. The requisite alignment capability (<100 nm) needed to support dense integration of face-to-face semiconductor ICs with 1 µm line/space
ii. Provides ability to correct initial mating misalignments of ±1 µm by a factor of >10 allowing deep sub-micron registration of component pairs.
iii. Increased throughput by utilizing less precise placement machines yet achieving deep sub-micron registration of component pairs.
iv. Ability to temporarily assemble ICs and re-work parts if alignment errors are detected
v. Incorporation alignment aids with standard IC processes
vi. Alignable-contacts use little IC real estate by integrating the mechanical aid into the bond pad directly. Individual and array of alignable-contacts correct translational and rotational errors.

BRIEF DESCRIPTION OF THE DISCLOSED TECHNOLOGY

This document discloses a method and devices for improving the alignment accuracy between 3D-stacked components such as IC dies, large area semiconductor tiles, and wafers. The method employs tapered alignable-contact microstructures that are capable of correcting initial lateral (x, y), and rotational misalignments of the relative positions of stacked components (ICs, dies, wafers, etc.) during the bonding (or integration) of the pair of components. The tapered alignable-contact microstructures are designed to force shifts in the x and y directions (lateral, in-plane) by transferring the z-directed force (between the components) that occurs during the approach of the pair into an in-plane force that shifts the components positions into accurate registration. Under ideal conditions, the registration capability of this technology is sub-100 nm and can correct initial approach misalignments of ±1 µm (thereby providing a factor of 10× improvement in the registration between two IC dies or wafer bearing the microstructures).

Several types of tapered alignable-contact microstructure devices are disclosed that utilize a pin and trench or sleeve configuration. These microstructures can be fabricated using standard IC processes (i.e., lift-off lithography and deposition) and can be scaled from partial elements (providing alignment adjustments in the +x, −x, +y or −y directions), single elements (providing alignment adjustments in the ±x and ±y directions) and arrays (that provide alignment adjustments in the x and ±y directions and rotational orientation). The alignment microstructures may be integrated as electrical contacts or they may be utilized solely (for primarily) for improving registration.

Another novel aspect of this method, for some applications, is that the aligned stacked components can be temporarily assembled so that alignment accuracy can be checked, and if needed, separated and re-assembled.

The technology disclosed herein focuses on improving the alignment accuracy between 3D-stacked IC components including die-to-die, die-to-wafer and wafer-to-wafer. The deep sub-micron alignment accuracy provided by this invention matches the needed dimensional tolerances for achieving optimal face-to-face integration of advanced CMOS IC technologies. The alignable-contacts consist of tapered, and preferably interlocking, microstructures that are fabricated preferably using standard IC processes (stepper-based lithography, deposition, etching) and are CMOS compatible. As shown in FIG. 1, the alignable-contact pairs complement one another and the tapered shapes of the microstructures provide the capability to correct x, y, and rotational misalignments during the mating of the pair and to provide electrical conductivity (if desired) by thermocompression bonding. 40° to 80° sidewall tapers of the microstructures are preferred and found been found to be able to induce shifts in the x- and/or y-directions (lateral, in-plane) by transferring the z-directed assembly force that occurs normal to the tapered surface during the approach of the pair of components. This provides a ~10× improvement in component registration. The degree of tolerance to initial misalignment is set by the dimensions of the tapers and can be adjusted by changing the height of the structures and/or the metal used to form the tapered structures. For typical microelectronic flip-chip bonding, the initial misalignment is set by the optically-based alignment capability of the die or wafer bonder, assuming the microstructures are preferably formed by a self-aligned process so that the relative orientations of the microstructures on a given die or wafer do not introduce potential additional misalignment problems. For most high-end commercial die and wafer bonders, submicron-level placement accuracy is available. Base on this, the amount of taper and the dimensions of the microstructures can be set to accommodate this initial misalignment ($3\sigma@\pm1$ μm). For example, assuming that the microstructures are of a truncated pyramidal shape (pin and sleeve) as depicted by FIG. 1 and for a ±1 μm initial misalignment and a taper angle of 70° for the pin, a height of −1.5 μm would be desirable for each of the complementary microstructures so that as mating occurs between the microstructures, the taper causes movement in lateral and/or rotational directions as described above to yield a perfect fit (i.e. zero final misalignment). For microstructures having a tapered pin and trench design, the height of the pin would be 3 μm and the trench depth would be larger than >3 μm. Under near-ideal experimental conditions, the registration capability (the maximum relative alignment error that can be corrected to achieve perfect alignment (zero misalignment)) of the mechanical aids provided by the microstructures is sub-100 nm.

The process flows for fabricating the alignable contacts are illustrated in FIGS. 4A1 thru 4D3. The both pairs of microstructures are preferably fabricated using standard IC processes (i.e., lift-off lithography, deposition). The microstructures forming the alignable-contacts are designed to correct alignment in both the x and y directions of the chips, die or wafers on which they are disposed when those chips, die or wafers are bonded together. Rotational corrections are also possible by using the arrays of the alignable-contact microstructures 10, 12 which serve, in use, as mechanical alignment aids.

The 45-to-80° sidewall tapers of the microstructures are acute angles with reference to a perpendicular extending from a major surface of the chips, dies or wafers, the sidewall tapers being able to induce shifts in the x- and/or y-directions (lateral, in-plane) by transferring the z-directed assembly force that occurs normal to the component's surfaces into a shear force that adjusts the relative positions of the components during the engagement (approach) of the components. If Au is utilized as the material to form the microstructures, then as a byproduct of using Au, the sidewall tapers are apt to fall in the range of 70-to-78°. Other acute angle sidewall tapers may be used and if the material of the microstructures is something other than Au then the sidewall taper will likely fall in a different range of acute angles. The term "acute angle" as used herein refers to an angle greater than 0 degrees but less than 90 degrees and is preferably an angle which occurs when a metal is deposited thru an opening in a sacrificial layer (such as a photoresist) having a re-entrant profile.

The magnitude of the in-plane shear force shear generated by the microstructures which serve as mechanical alignment aids (alignable-contact) can be tailored by increasing the numbers of alignable-contacts. The minimum required force magnitude required is determined by calculating the overall mass and area of the component and the clamping force used to restrain it (i.e. vacuum, electrostatic, etc.) as these are the factors that contribute to the frictional forces that are needed to be overcome to reposition the components.

A final variation of the integrated alignable-contact is a distributed approach in which partial elements of tapered microstructures are included across an array. This approach could be utilized in applications where there is a demanding pitch or area constraint that cannot accommodate the full structure. FIG. 4 shows an example where the east, west, north and south sidewall structures are distributed across four contact pads. These partial structures can be dispersed within an array or in strategic positions.

BRIEF DESCRIPTION OF THE DRAWINGS

FIG. 2B also shows a lateral gap G between the distal edge of a wedge type microstructure on the upper chip versus the distal edge of a wedge type microstructure on the lower chip, the gap G being sized to accommodate registration errors of the bonding equipment. The size of the wedges relative to the chips is exaggerated for ease of illustration and explanation.

FIGS. 3A-1 thru 3C-1 are SEM views of three possible embodiments of pin type microstructures of tapered alignable-contact pairs while FIGS. 3A-2 thru 3C-2 depict sleeve type microstructures which correspond respectively to the pin type microstructures of FIGS. 3A-1 thru 3C-1. The structures in FIGS. 3A-1 and 3B-1 have 4-fold symmetry and the structure in FIG. 3C-1 has individually circular (infinite) symmetry and as a pair they have 2-fold symmetry.

FIGS. 5A-1 thru 5D-3 depict exemplary process flows for fabricating different embodiments of the microstructures of tapered alignable contacts using semiconductor fabrication techniques.

DETAILED DESCRIPTION

Figures 1, 1A, 2:
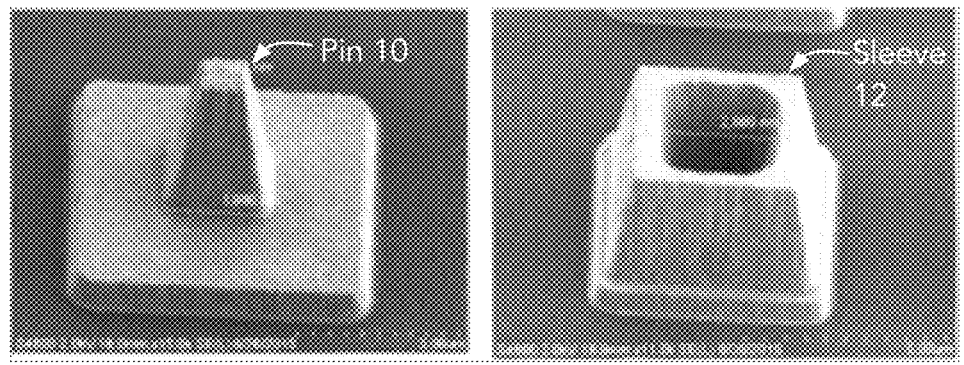
FIGS. 1A-1 and 1A-2 are Scanning Electron Microscope (SEM) views of an example of one embodiment of microstructures forming an alignable-contact pair using a pin (see FIG. 1A-1) and sleeve (see FIG. 1A-2) construction in this embodiment. These structures have 4-fold symmetry.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Disclosed is a method and devices for improving the alignment accuracy between 3D-stacked components such as IC die, large area semiconductor tiles, and wafers. The method employs tapered alignable-contact microstructures that are capable of correcting initial x, y and also rotational misalignments of the stacked components' relative positions during the mating of the pair. Multiple embodiments of these tapered alignable-contact microstructures are described herein. One embodiment appears in FIGS. 1A-1 and 1A-2, which are Scanning Electron Microscope (SEM) views of an example of one embodiment of microstructures forming an alignable-contact pair using, in this embodiment, a pin 10 (see FIG. 1A-1) and sleeve 12 (see FIG. 1A-2) construction. The pin 10 (or multiple pins) would be disposed on one chip (for die, or wafer, etc.) while the sleeve 12 (or multiple sleeves corresponding to the multiple pins) would be disposed on another chip (for die, or wafer, etc.) which is to be brought into registration with the first mentioned chip and then bonded together using the pin or pins 10 and the sleeve or sleeves 12 as they engage each other. In FIGS. 1B and 1C, the pin 10 is disposed on chip 6 while the sleeve 12 which which is mates disposed on chip 8. FIGS. 1B and 1C are cross sectional views so only the two side edges of the sleeve 12 are depicted.

The pin 10 preferably has tapered sidewalls and the sleeve 12 also preferably has tapered interior sidewalls, although the interior sidewalls of the sleeve 12 cannot be seen in this SEM view, the sloping sidewalls S of the pins 10 and the interior sidewalls S of sleeve 12 are identified in FIG. 1C. Typically both the pin 10 and the sleeve have tapered (or sloping) sidewalls which engage each other when the pin 10 and sleeve 12 are brought into engaging contact with each other (in the z direction), but it should be sufficient if only one of the pins 10 and/or sleeves 12 has a tapered or sloping sidewall.

Tapered or sloping sidewalls may be formed using fabrication techniques known in the art. See, for example, Appendix A which describes "Image Reversal Resists and their processing" and uses tapered shadow masks (see FIG. 107 thereof) to achieve tapered structures.

The microstructures forming an alignable-contact pair pin 10 and sleeve 12 (for example) allow initial misalignments of, for example ±1 µm, between the centerline of the pin and the centerline of the sleeve to be corrected during the approach of the contacts in a bonding machine, for example. See FIG. 1B which depicts two chip (or dies, wafers, etc.) 6, 8 disposed on two surfaces of bonding equipment as the bonding equipment is closing as that its plates are coming closer together (in the z-direction). The chips 6, 8 are initially held in place on the bonding equipment by vacuum pressure, for example. As the tapered or sloping surfaces of the pins 10 and sleeves 12 start to engage each other, a lateral force (in the x and/or y directions) and a perpendicular force (in the z-direction) develop since the two chips 6, 8 are initially restrained from lateral movement by the aforementioned vacuum (of other means). The force applied in the z-direction can be sensed by modern bonding equipment, and soon after that z-direction force is sensed, the vacuum is released allowing the two chips 6,8 to move laterally as is depicted by the arrows on the chips 6, 8. As the plates of the bonding equipment move closer together, the tapers or sloping edges S of the pins 10 and sleeves 12 continue to urge the two chips 6, 8 into better and better registration with each other.

Instead of using a vacuum to temporarily hold the two chips 6, 8 in place, other temporary chip restraining techniques can be used, such as using electrostatic or magnetic forces or even surface tension or adhesion forces to retain the chips temporarily on the bonding equipment. Whatever technique is used, it should be one which can be turned off (such as the vacuum mentioned above) and/or which can be overcome by the lateral forces imparted by the microstructures forming an alignable-contact pair 10, 12.

Arrays of microstructures forming alignable-contact pairs (such as pin 10 and sleeve 12) may be utilized to generate sufficient shear force to urge the microstructures and thus the chip (dies, ICs, wafers, etc.) 6, 8 on which they reside into proper registration with each other, preferably without deformation of the individual components. After the microstructures 10, 12 are in fully aligned position (so that their centerlines preferably coincide), a permanent electrical contact between the pin 10 and the sleeve 12 may formed by methods such as thermocompression bonding. If arrays of these microstructures 10, 12 may be utilized, then some pin/sleeve pairs may be utilized as electrical contacts while others may be used simply to help register the chips 6, 8.

Pin 10 and sleeve 12 type microstructures are desirable as alignable-contact pairs, but as will be seen, the microstructures may assume other configurations, such as wedges which have at least one tapered or sloping surface between them which acts to urge the chips 6, 8 laterally when they are being squeezed together in a bonding machine. The shapes of the microstructures may include cones, truncated cones, pyramids, wedges, and frustra. Other geometric shapes of the microstructures will also doubtlessly suggest themselves to those who familiarize themselves with this technology.

In FIG. 1B the shifting is shown by the arrows as occurring in the x-direction, but it should be understood that shifting may also (or alternatively) be occurring in the y-direction as well as perhaps some rotational movement (about the z axis), as needed, to bring the two chips 6, 8 into proper relative registration while the plates of the bonding equipment are moved in the z-direction. Since the vacuum is released as the microstructures 10, 12 start to engage, the chips 6, 8 can then start to move freely into proper registration with each other.

The tapered alignable-contact microstructures (such as pins 10 and sleeves 12) are designed to force shifts in the x and/or y directions (in-plane and as needed) and possibly rotationally about the z axis by transferring the z-directed motion that occurs during the approach of the pair into an in-plane force that shifts the chips' position(s) (as needed) into accurate registration. Under ideal conditions, the registration capability of this technology is sub-100 nm and can correct initial approach misalignments of up to ±1 µm (thereby providing a factor of 10× improvement compared with not using this technology). In order to accommodate a possible misalignment of ±1 µm, the edges at distal ends of the pins 10 and sleeves 12 should be spaced 1 µm from each other as shown by FIG. 1C when properly centered (on their respective centerlines CL) thereby forming a gap G of 1 µm.

The size of the gap G depends on the positional (x, y) accuracy of the bonding equipment. If the bonding equipment has a better positional (x, y) accuracy than ±1 µm, then the gap C may be made smaller. Precision bonding equipment should have a positional (x, y) accuracy of ±1 µm or better, so that its lateral positional error is no greater than 1 µm.

The pins 10 are depicted as has having a flat top at their distal ends. Those ends and indeed the distal ends of the sleeves 12 can be made sharp or pointed, if desired, but that would probably involve a more lengthy fabrication process. Since a longer fabrication process tends to increase expense, the tops of the pins and sleeves are likely to be flat as shown.

The sidewalls S of the pins 10 and sleeves 12 are preferably disposed at an acute angle (preferably between 20 and 45 degrees relative to a perpendicular (see CL of FIG. 1C, for example) to a major surface MS of the chip 6, 8 on which they are disposed. Assuming that the pins 10 and sleeves 12 are formed of Au, Au tends to deposit with an angle of 70 to 78 degrees from the major surface MS when the pins 10 and sleeve 12 are formed as subsequently described herein. If the pins 10 and sleeves 12 are formed instead of Ti, Ti tends to deposit with an angle of about 45 degrees from the major surface MS.

As is noted above, the tapered alignable-contact microstructures 10, 12 are designed to force shifts in the x and/or y directions (in-plane) by transferring the z-directed motion that occurs during the approach of the pair into an in-plane force that shifts the chip's position into accurate registration. The alignable-contact microstructures 10, 12 may be implemented by a pair (or more) of tapered wedges 10, 12, since the desirable feature of a taper or slope S can be implemented by a simple wedge shape, which is shown and described in greater detail below with reference to FIGS. 2A and 2B. A pin and sleeve configuration is convenient since the depicted sleeve 12 of FIG. 1A effectively defines four wedges, but there is no particular need for the four wedges to be in very close proximity to each other, rather they could be more widely separate on the surface of a chip 6, 8 as shown and described in greater detail below with reference to FIGS. 2A and 2B.

Figure 1B:
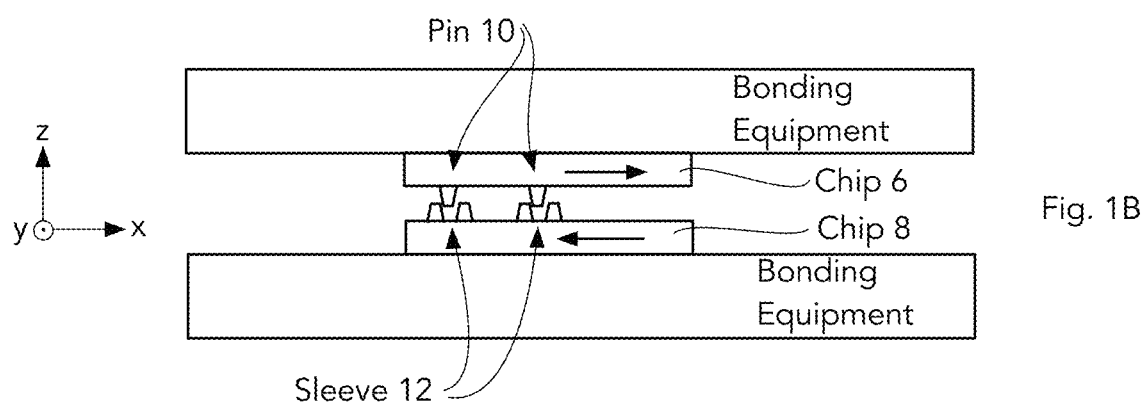
FIG. 1B depicts, in a side elevational view, two chip (or dies, wafers, etc.) disposed on two surfaces of bonding equipment, each chip having multiple microstructures which for an alignable-contact pair using a pin and sleeve type construction. In the embodiment of FIG. 1B, the pins (shown in cross section) are on the upper chip while the sleeves (also shown in cross section) are on the lower chip. The size of the pins and sleeves relative to the chips is exaggerated for ease of illustration and explanation.
Figure 1C:
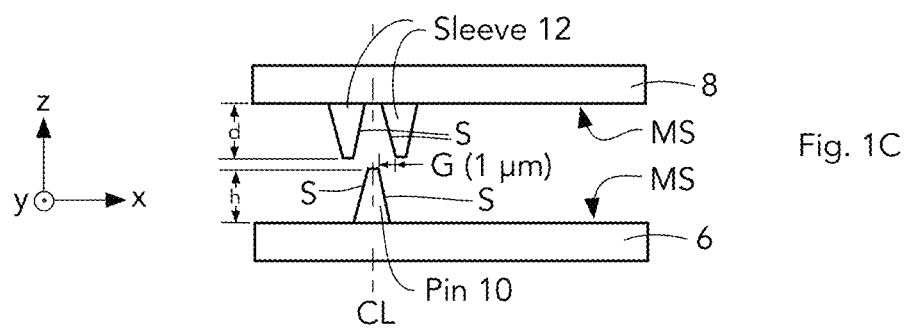
FIG. 1C is a side elevational view of the showing the mating of a pin and sleeve (or alternatively wedges) forming the microstructures of an alignable-contact pair, this view also a lateral gap G between the upper edge of a pin versus the upper edge of a mouth of the sleeve which it is to enter (or alternatively between the upper edges of the wedges), the gap G being sized to accommodate registration errors of the bonding equipment.

The pin 10 and sleeve 12 of FIG. 1A are depicted with four sides, but they may be of any convenient shape provided that their is t least one tapered or sloping surface between them. A tapered wedge type embodiment is described bellow with reference to FIGS. 2A and 2B and additional pin and sleeve type embodiments are depicted and described below with reference to FIGS. 3A-1 thru 3C-2.

Several embodiments of tapered alignable-contact microstructure devices are disclosed that utilize a pin and trench or sleeve type configuration. These microstructures can be fabricated using standard IC processes (see Appendix A for example) and can be scaled from partial elements (providing alignment adjustments in the +x, −x, +y or −y directions), single elements (providing alignment adjustments in the ±x and ±y directions) and arrays (that provide alignment adjustments in the +x and ±y directions and rotation). The alignment microstructures may be integrated as electrical contacts. Another novel aspect of this method, for some applications, is that the aligned stacked components can be temporarily assembled so that alignment accuracy can be checked, and if needed, separated and re-assembled before compression bonding occurs.

The technology disclosed here focuses on improving the alignment accuracy between 3D-stacked IC components including die-die, die-wafer and wafer-wafer, chip-to-chip, chip-to-wafer, etc. The sub-micron alignment accuracy provided by this technology matches the needed dimensional tolerances for achieving optimal face-to-face integration of advanced CMOS IC technologies. The alignable-contacts consist of tapered, preferably interlocking, microstructures that are fabricated using standard IC processes (see Appendix A as well as stepper-based lithography, deposition) and are CMOS compatible. As shown in FIG. 1A, the alignable-contact pairs 10, 12 complement one another and the tapered shapes of the microstructures provide the capability to correct x, y, and theta misalignments during the mating of the pair.

The 70-to-78° sidewall tapers (for Au) of the microstructures are able to induce shifts in the x- and/or y-directions (in-plane) by transferring the z-directed assembly force that occurs normal to the tapered surface during the approach of the pair of microstructures. This provides a ~10× improvement in component registration. The degree of tolerance to initial misalignment by the bonding equipment is set by the dimensions of the tapers and can be adjusted by changing the height of the structures 10, 12. For typical microelectronics bonding, the initial misalignment is set by the optically-based alignment capability of a die or wafer bonder (the boding equipment). For most high-end commercial precision die and wafer bonders, sub-micron-level placement accuracy is available. Base on this, the taper dimensions can be set to accommodate this initial misalignment (3σ@±1 μm). For example, for a ±1 μm initial misalignment and a taper angle of 70° for the pin 10, a height of ~1.5 μm would be needed for each of the complementary microstructures 10, 12. Under ideal conditions, the registration capability of the mechanical aids is sub-100 nm.

Figure 2A:
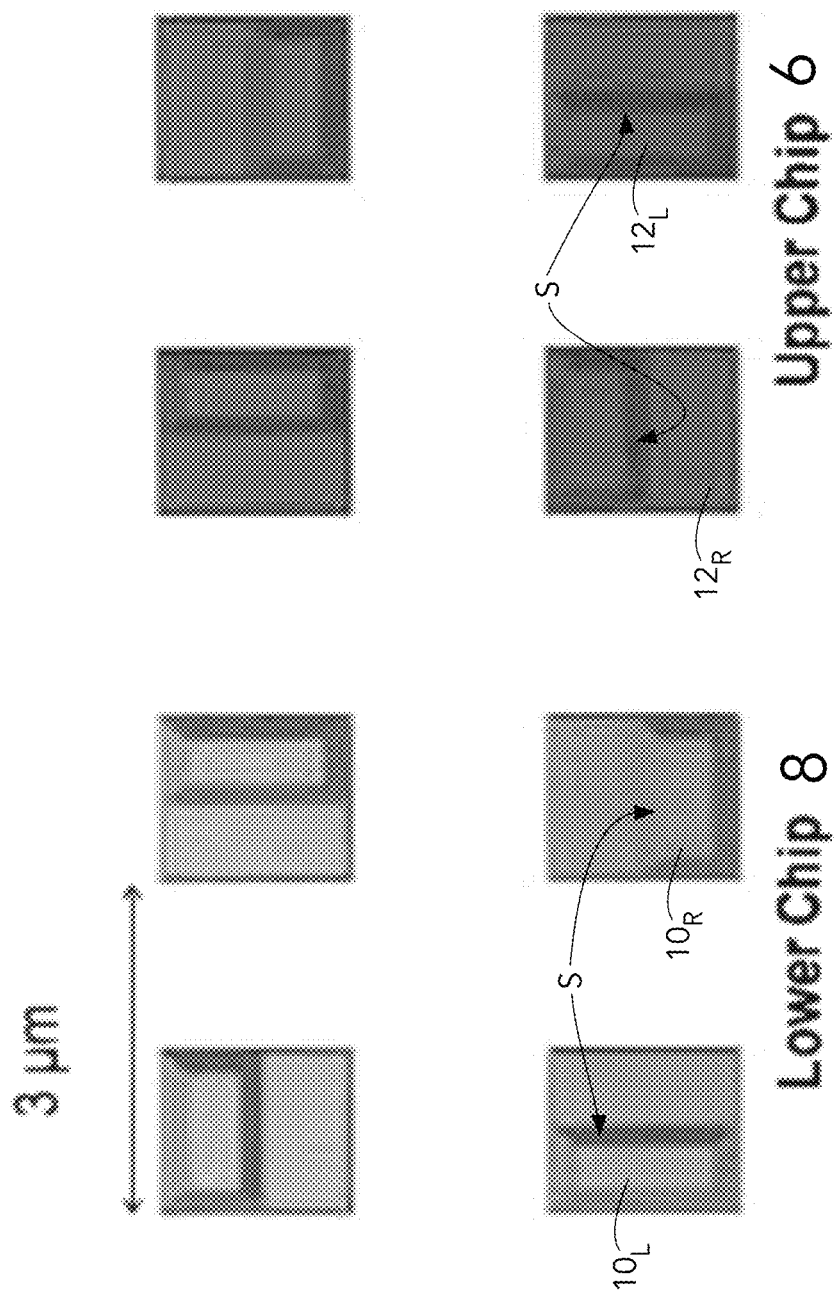
FIG. 2A is a SEM view of four wedge type microstructures on a lower chip and also four corresponding wedge type microstructures on a upper chip, which chips are to be mated using bonding equipment as shown in FIGS. 1B and 2B, the wedge type microstructures having tapered or sloping surfaces for urging one or both of the chips in better alignment when the wedge type microstructures on the lower chip engage the wedge type microstructures on the upper chip when the plates of the bonding equipment are moved towards each other. These structures have 1-fold symmetry.
Figure 2B:
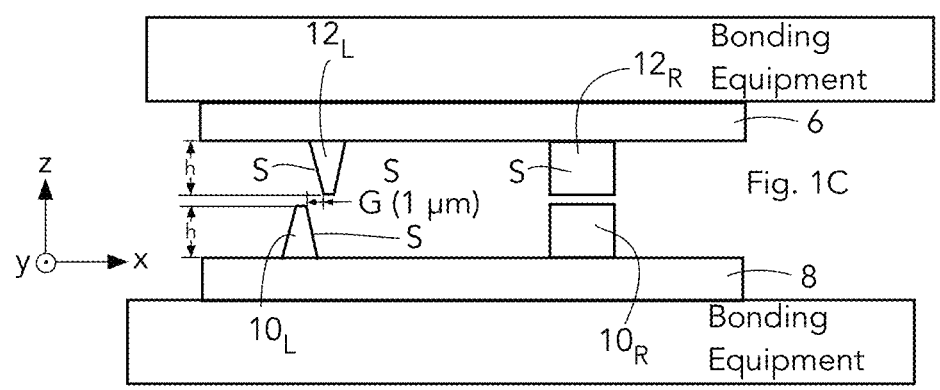
FIG. 2B depicts, in a side elevational view, two chip (or dies, wafers, etc.) disposed on two surfaces of bonding equipment, each chip having multiple wedge type microstructures which for an alignable-contact pair using a pin and sleeve type construction. In the embodiment of FIG. 2B, the wedges (shown in cross section) are disposed on both the upper chip and the lower chip.

FIG. 2A depicts an embodiment where the tapered microstructures are formed as a 2×2 array of wedges $10_R$ and $10_L$ on the surface of a lower chip 6 and of wedges $12_R$ and $12_L$ on the surface of an upper 8 chip. Their tapers are identified with the letter S. FIG. 2B depicts a first wedge $12_L$ on the upper chip 6 about to engage a first wedge $10_L$ on the lower chip 8 and a second wedge $12_R$ on the upper chip 6 about to engage a second wedge $10_R$ on the lower chip 8, as the two chips 6, 8 are being brought together by the bonding machine. The second wedge-shaped alignable-contact pair $10_R$, $12_R$ are disposed at a right angle (about the z axis) relative to the first wedge-shaped alignable-contact pair $10_L$, $12_L$. That right angle matches with the desire to effect translation in both the x and y directions (as needed) when the two chips 6, 8 engage, but these wedge-shaped alignable-contact pairs may be disposed at other angles than a right angle relative to each other. If the chips 6, 8 have large numbers of alignable-contact pairs, then some may be of the pin and sleeve type with others may be of the wedge shape and the various wedge shape pairs may be disposed at various angles with respect to other wedge pairs.

The reader will note that the same reference numerals 10, 12 are used for the pin and sleeve embodiment and for the 2×2 array of wedges embodiment, and this is intended to help emphasize the fact that the tapered microstructures may assume any convenient shape, but at least one of the two opposing microstructures 10, 12 has at least one tapered surface to urge the substrates of the two chips 6, 8 into proper alignment. It should also now be apparent that a single microstructure pair comprising a pin and a sleeve embodiment of FIG. 1A as eight tapered surfaces, four on the pin 10 and four on the sleeve 12 to urge the substrates into alignment, whereas the wedge embodiment of FIGS. 2A and 2B requires four pairs of wedges to attain eight tapered surfaces.

Figures 1, 3A:
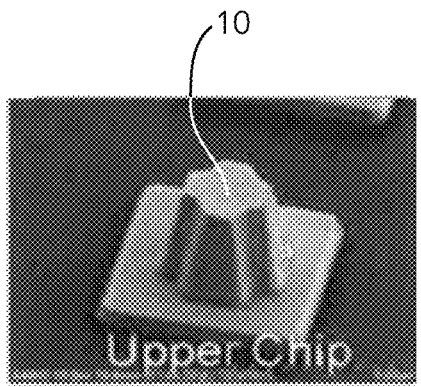
Figures 1, 3B:
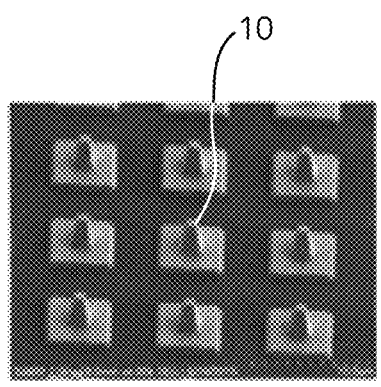
Figures 1, 3C:
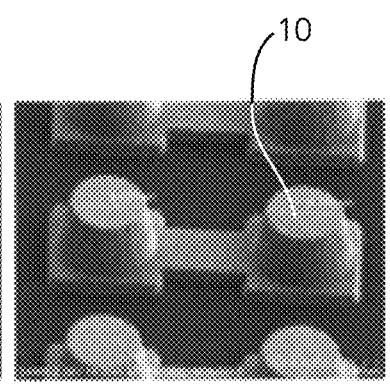
Figures 2, 3A:
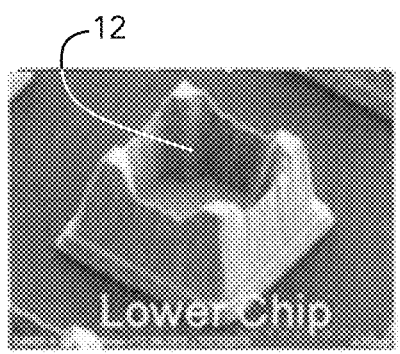
Figures 2, 3B:
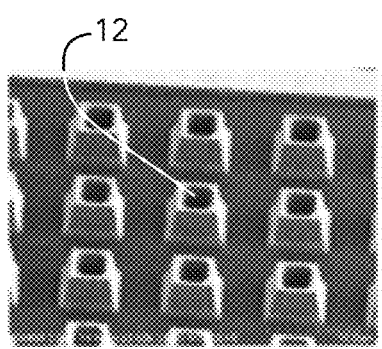
Figures 2, 3C:
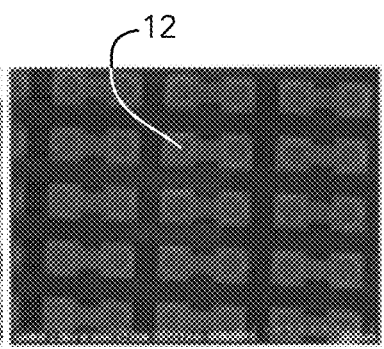

FIGS. 3A-1 thru 3C-1 are SEM views of three possible embodiments of pin type microstructures of tapered alignable-contact pairs while FIGS. 3A-2 thru 3C-2 depict sleeve type microstructures which mate respectively to the pin type microstructures of FIGS. 3A-1 thru 3C-1. These embodiments may be used to together, if desired, and may be used with the wedge type microstructures described with reference to FIGS. 2A and 2B. Additionally, the pins (and their corresponding sleeves) may be disposed on either (the upper or lower) chips or on each chips may have a mixture of pins, sleeves and wedges. Pairs (for example) of pins 10 and sleeves 12 may be connected electrically together (as pairs or in even greater groupings) as in the embodiment of FIGS. 3C-1 and 3C-1 in order to reduce contact resistance.

The tapered surfaces in the previously described embodiments are planar surfaces, but non-planar surfaces may additionally or alternatively used. See for example the embodiment of FIGS. 3C-1 and 3C-2 where the pins 10 are round in cross section while the 12 may also be round in cross section but with tapered sides, much like a funnel.

Figure 4A:
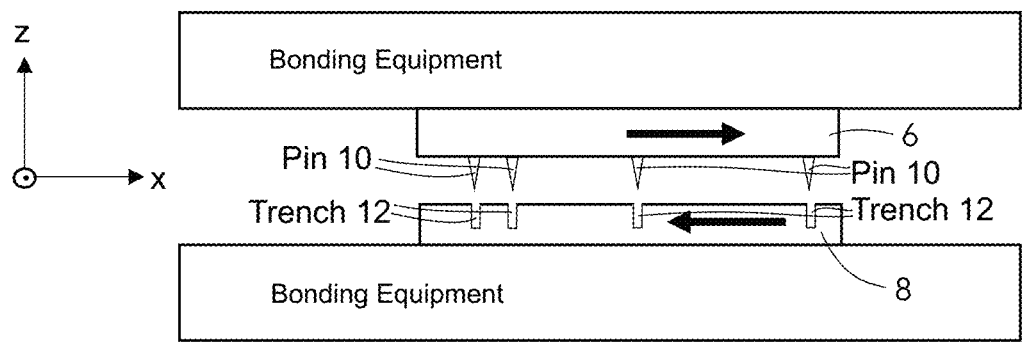
FIGS. 4A-4C depict embodiments where trenches are formed in a chip instead of sleeves form on a chip, the trenches receiving pins during chip bonding.
Figure 4B:
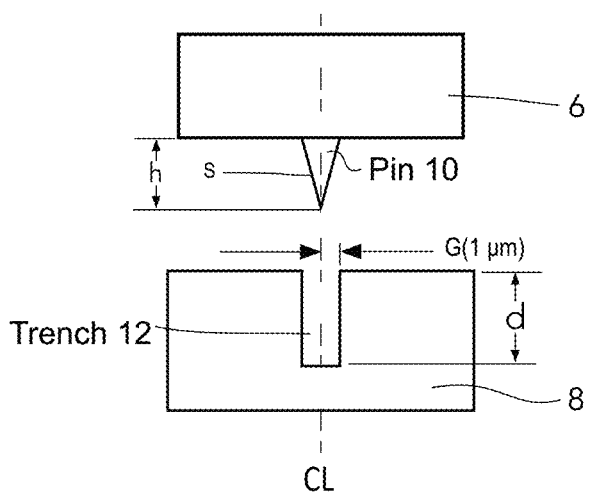
Figure 4C:
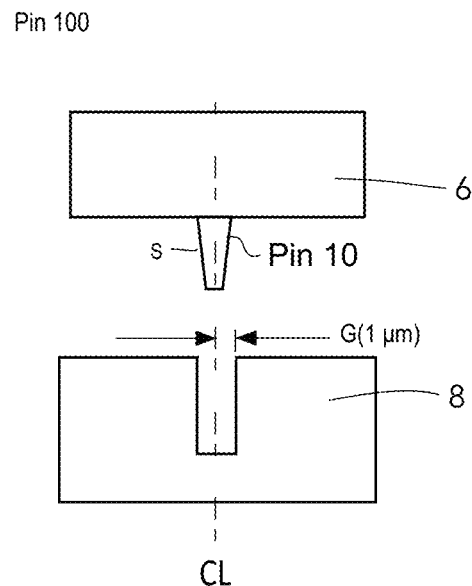

Instead of forming sleeves 12 on a surface of a chip, trenches 12, which accomplish basically the same function as sleeves, may instead be formed in a chip as shown by FIGS. 4A-4C. The pins 10 may have a sharp or pointed end or may be wedge-shaped as in the embodiment of FIGS. 2A and 2B and may have a sharp or knife-edge like end (see FIG. 4B) or be more blunt (see FIG. 4C). The trenches 12 are depicted with vertical sidewalls (for ease of fabrication) and may be square, rectangular, round or some other convenient shape in cross section. The pins 10 have tapered or sloping sidewalls S as in the previous embodiments for urging chips 6, 8 in the direction of the arrows when the pins 10 engage the trenches 12 when brought into engagement by the bonding equipment. As in the previous embodiments, the microstructures of the alignable-contact pair 10, 12, have a lateral gap G between the edge or point of centerline of a pin 10 and the mouth of the trench 12 which it is to enter, the gap G being sized to accommodate registration errors of the bonding equipment (such as 1 μm).

Figures 3A, 5B:
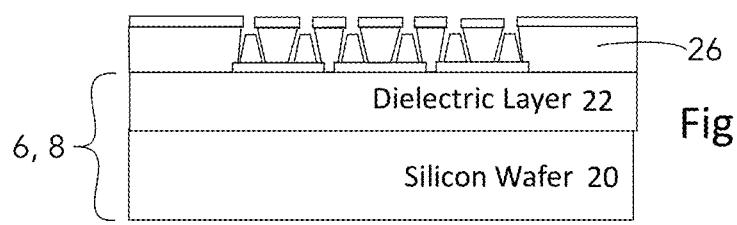
Figures 4A, 5B:
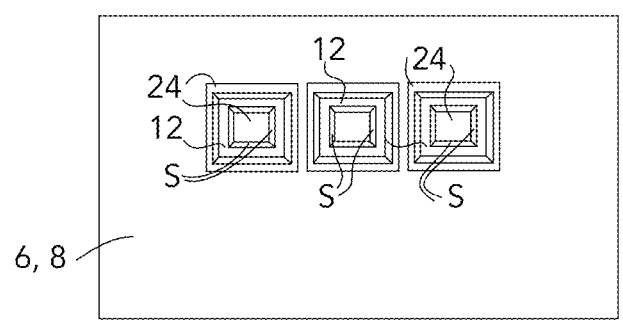
Figures 1, 5C:
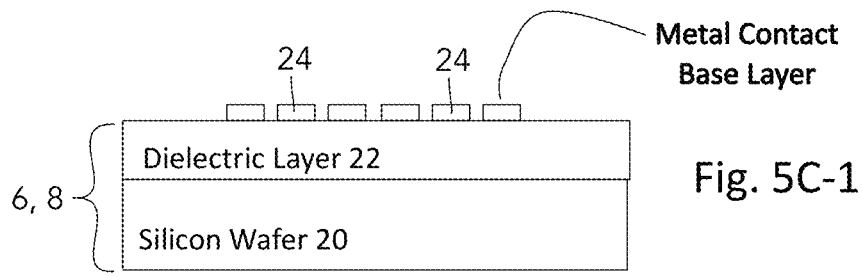
Figures 2, 5C:
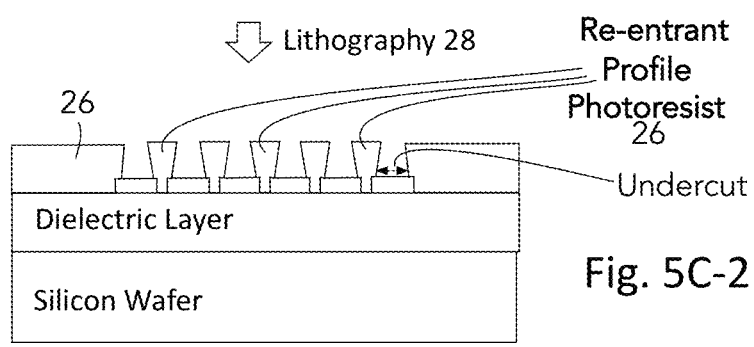
Figures 3, 5C:
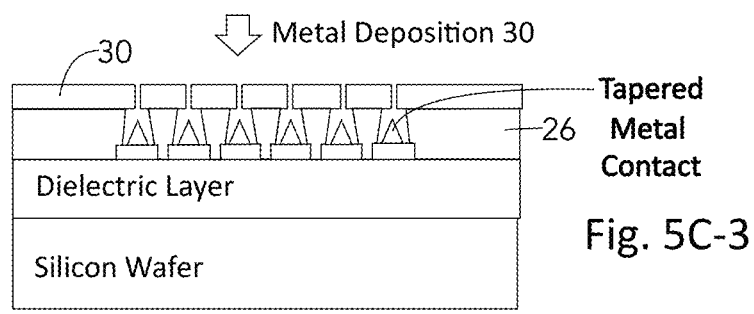
Figures 4, 5C:
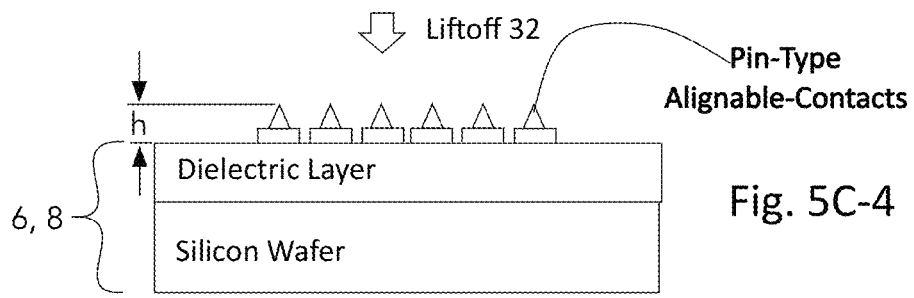
Figures 1, 5D:
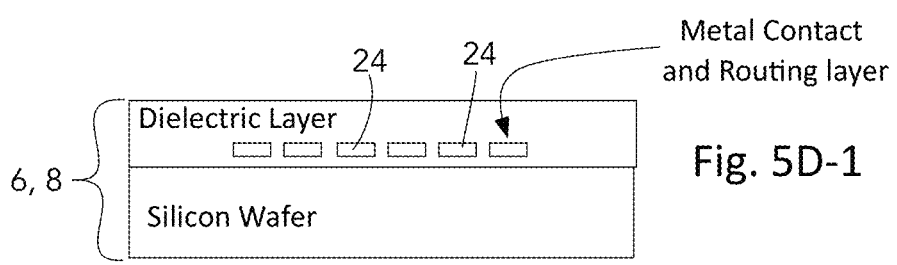
Figures 2, 5D:
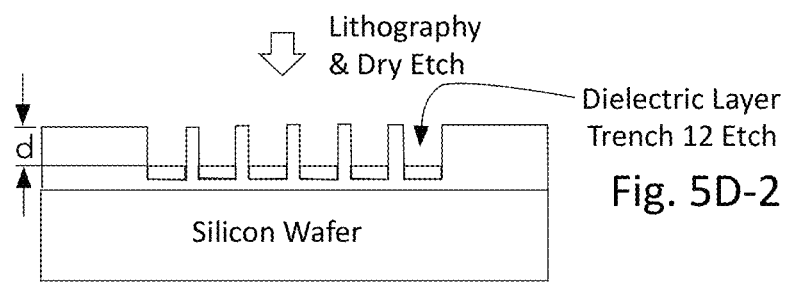
Figures 3, 5D:
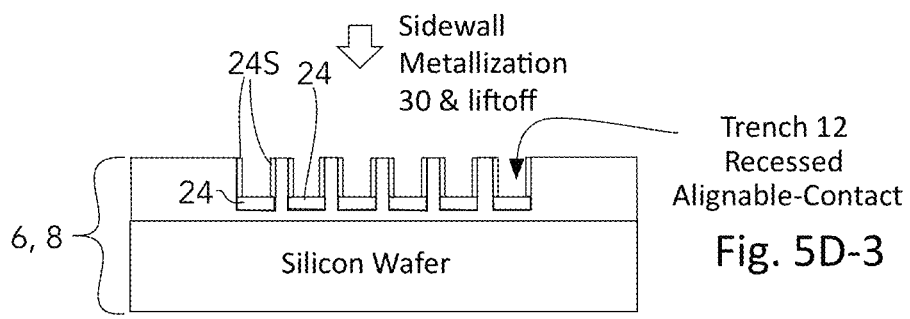
Figure 6:
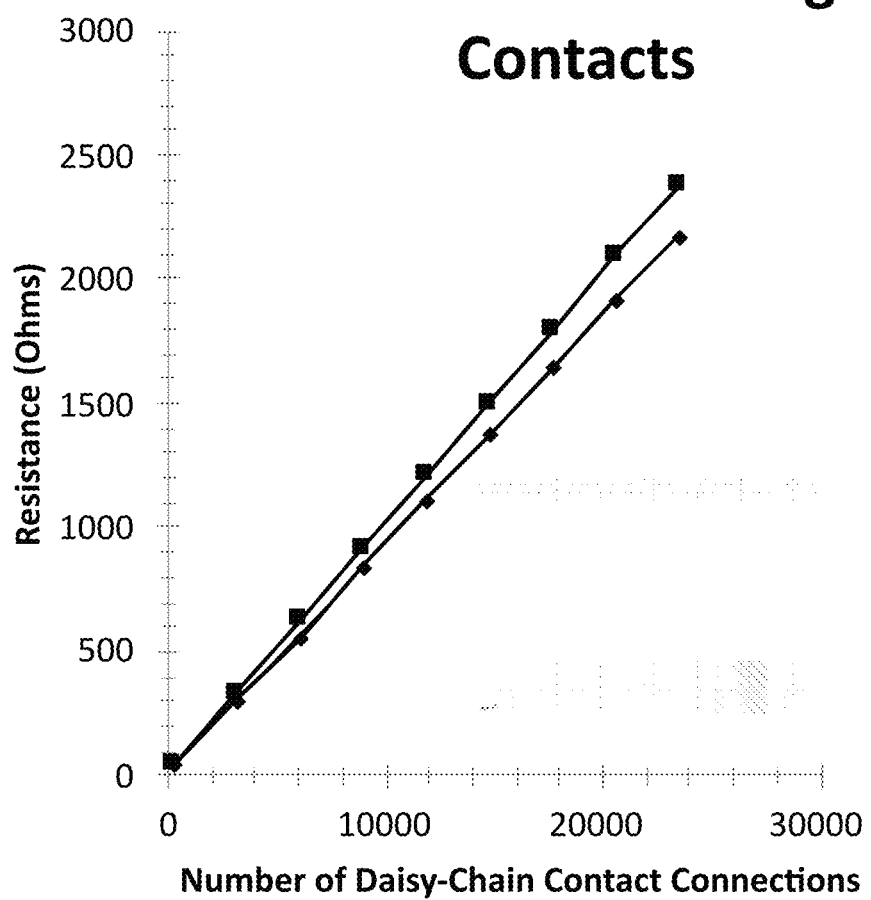
FIG. 6 depicts Daisy-Chain Array test arrays formed by linking bridging units on an upper and lower chips with up to 25,000 alignable-contacts of the types depicted in FIGS. 3A-1 and 3A-2, using Au—Au thermo-compression bonding, which are connected in series for this test.

The microstructures forming an alignable-contact pair pin 10 and trench 12 allow initial misalignment of, for example ±1 micron, between the center line of the pin 10 (FIG. 4-B) or the distal edge of the pin (FIG. 4-C) and the centerline of the trench 12 to be corrected during the approach of the contacts in a bonding machine, for example. FIG. 4-A depicts two chips (or dies, wafers, etc.) 6, 8 disposed on two surfaces of bonding equipment as the bonding equipment is closing as that its plates are coming closer together (in the z-direction). The chips are initially held in place on the bonding equipment by vacuum pressure, for example. As the tapered or sloping surface of the pin 10 and vertical sidewall of the trench 12 start to engage each other, a lateral force (in the x-direction or y-directions) and a perpendicular force (in the z-direction) develop since the two chips are initially restrained from lateral movement. The force applied in the z-direction can be sensed by modern precision bonding equipment, and soon after that z-direction force is sensed, the vacuum is released allowing the two chips to move laterally as is depicted by arrows on the chips 6,8. As the plates of the bonding equipment move closer together, the tapers of the pin 10 and the vertical sidewalls of the trench 12 continue to urge the two chips into better and better registration with each other. Electrical connection of the alignable-contacts are formed along the sidewalls of the pin 10 and trench 12 and/or at the bottom of the trench locations with the sharp or blunt end of the pin 10.

Examples of process flows for fabricating different embodiments of the microstructures of tapered alignable contacts are illustrated by FIGS. 5A-1 thru 5D-3. The process steps for fabricating the pin (FIGS. 5A-1 thru 5A-4) and sleeve (FIGS. 53-1 thru 5B-4, 5B-3A and 5B-4A) and sharp pin (FIGS. 5C-1 thru 5C-4) and trench (FIGS. 5D-1 thru 5D-3) microstructure embodiments are shown. The fabrication of these microstructures 10, 12 preferably employs standard semiconductor fabrication processes starting with a semiconductor substrate 20 (such as silicon) with an optional dielectric layer 22 which form the upper and/or lower chips, dies or wafers 6, 8 (see FIGS. 5A-1, 5B-1, 5C-1) or a semiconductor substrate 20 (such as silicon) with an optional dielectric layer 22 and a buried metal layer (see, for example FIG. 5D-1). The microstructure alignable-contacts 10, 12 may be constructed upon base metal contact pads 24 for routing data, signals, and/or voltages, including a ground for whatever circuits are embodied in chips, dies or wafers 6, 8. The base metal contact pads 24 may be omitted, for example, if any of the microstructure alignable-contacts 10, 12 are not used to make electrical contact(s) between chips, dies or wafers 6, 8, but rather are used to bond the two together.

The process steps include Step 1: Deposition and lithography to pattern the metal of optional base contacts 24 (see FIGS. 5A-1, 5B-1, 5C-1 to 5C-3 and 5D-1). As is noted above, this Step 1 may be omitted if the contacts 24 are not utilized. Step 2: Lithography 28 to attain a re-entrant profile (with undercut) of the photoresist 26 used to making the alignable microstructures, (see FIGS. 5A-2 and 5C-2), sleeve (FIG. 5B-2). The lithography for the trench embodiment (see FIGS. 5D-2) need not be re-entrant, but rather the sidewalls of the trench may be vertical. The re-entrant profile of the pin, sleeve and sharp pin embodiments may be attained using image reverse lithography. See Appendix A for a discussion of image reverse lithography. The photoresist 26 has openings therein above optional base contacts 24 and the re-entrant profile of the photoresist (if used) is intentionally undercut, as shown. Step 3: Evaporation or sputtering of metal 30 (such as Au) to form the tapered sidewall pin type microstructures 10, (see FIGS. 5A-3 and 5C-3), tapered sleeve sidewall microstructures 12 (FIG. 5B-3) or non-tapered trench sidewalls 26S (see FIG. 5D-3) and Step 4: Removal of the photoresist layer 26, if used (see FIGS. 5A-4, 5B-4, and 5C-4), together with liftoff of metal 30 not utilized in the formation of the microstructures.

The pairs of microstructures 10, 12 which are designed to mate are preferably fabricated using standard IC fabrication processes (i.e., lift-off lithography, deposition) and the fabrication of certain embodiments is explained above. The alignable-contacts are designed to correct alignment of the chips 6, 8 being bonded together in both the x and y directions. Rotational corrections are also possible by using the arrays of the alignable-contacts 10, 12.

There are numerous possible design variations of the microstructure forming alignable-contact pairs, at least one of the contacts of a pair has a tapered or sloping edge which, when engaged by the other contact of the pair, causes translational and/or rotational movement to occur when the ICs on which they are disposed are brought together for bonding. Examples of some these microstructures are described with reference to the foregoing figures. Other designs for such microstructures will now likely suggested themselves to those skilled in the art.

The magnitude of the in-plane force generated by the alignable-contacts can be tailored by increasing their numbers and/or by changing the contact metal to a metal with a different stiffness (Au, W, Ti, Pd, Ni, Cu). The required magnitude required is determined by calculating the overall mass of the component and the clamping force used to restrain it (i.e. vacuum, electrostatic, etc.) as these are the forces needed to be overcome to reposition and register the chips, dies or wafers 6, 8.

To demonstrate the utility of the integrated alignable-contact structures, FIG. 5 shows the results from mating daisy-chain arrays that were formed using the pin and sleeve type microstructures to bridge between the top and bottom chips which were mated. The misalignment in the X and Y directions was <0.5 µm as measured by external alignment targets viewed with an IR microscope. The average resistance over the array was about 0.1 Ohm per contact pair.

As previously mentioned, the sizes of the pin 10 and sleeve (or trench) 12 relative to the chips is exaggerated in the drawing figures for ease of illustration and explanation. Typical dimensions for the pin are 1 to 4 micron diameter bases and a height h less than 5 µm. The distal end of the pin 10 may be sharp (0.001 micron across) or blunt (2 µm across). The sleeve or trench may have a depth of less than 5 µm.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. An apparatus for laterally urging two electronic components into a different state of registration with respect to each other, the apparatus comprising:
   (i) a first structure disposed on a major surface of a first one of said two electronic components, wherein the first structure includes a slanting surface which is disposed at one or more angles relative to a perpendicular of said major surface, and
   (ii) a second disposed on a major surface of a second one of said two electronic components, wherein the second structure has a corresponding slanting surface that mates with or contacts, in use, the first structure, when the first and second structures are mated or being mated, the slanting surface of the first structure and the corresponding slanting surface of the second structure imparting a lateral shear force for urging the two electronic components into said different state of registration.

2. The apparatus of claim 1, in which the first component comprises an integrated circuit die, a semiconductor tile, or a semiconductor wafer, and the second component comprises an integrated circuit die, a semiconductor tile, or a semiconductor wafer.

3. The apparatus of claim 1, in which the first structure is formed of a first metal and the second structure is formed of a second metal, the second metal either being the same or different than the first metal.

4. The apparatus of claim 3, in which the first component further comprises a first electrical circuit with a first electrical contact, and the first electrical contact comprises the first structure, and the second component further comprises a second electrical circuit with a second electrical contact, and the second electrical contact comprises the second structure.

5. The apparatus of claim 1, in which the height of the first structure above the major surface of the first component is less than 5 microns, and the height of the second structure above the major surface of the second component is less than 5 microns.

6. The apparatus of claim 1, in which the slanting surface of the first structure is disposed at one or more angles between 45 and 85 degrees relative to the major surface of the first component.

7. The apparatus of claim 1, in which the first structure exhibits a 2-fold rotational symmetry about the first surface of the first component.

8. The apparatus of claim 7, further comprising a third structure disposed on the first surface of the first component, wherein the third structure is identical to the first structure and the third structure is oriented on the surface of the first component at a 90-degree angle relative to the first structure.

9. The apparatus of claim 1, in which the first structure exhibits a 4-fold rotational symmetry about the first surface of the first component.

10. The apparatus of claim 1, in which a first array of structures identical to the first structure is disposed on the first component, and a second array of structures identical to the second structure is disposed on the second component.

11. A two-piece device for electrically connecting two components, the device comprising:
(a) a first structure disposed on a first metal bond pad of a first electrical circuit of a first one of said two components, wherein the first structure has
    a tapered sidewall, and
    is comprised of a metal, and
(b) a second structure disposed on a second metal bond pad of a second electrical circuit of a second component, wherein
    the second structure is complementary to, and mates with, the first structure,
    the second structure is comprised of a metal with a corresponding tapered sidewall that engages the tapered sidewall of the first structure when the second structure mates with the first structure, imparting a lateral shear force.

12. A method for electrically connecting two integrated circuits, the method comprising:
providing a first integrated circuit that includes a first electrical bond pad;
forming on the first electrical bond pad a first structure, wherein the first structure is comprised of a first metal, the first structure having a shape that is selected from the group consisting of cones, truncated cones, pyramids, wedges, and frustra, and wherein a surface of the first structure is tapered,
providing a second integrated circuit that includes a second electrical bond pad,
forming on the second electrical bond pad a second structure, wherein the second structure is comprised of a second metal, the second structure having a shape that is complementary to the shape of the first structure with a corresponding tapered surface thereby allowing the second structure to engage the first structure as said corresponding tapered surface of the second structure engages said tapered surface of the first structure, and
disposing the first integrated circuit on the second integrated circuit such that the first structure mates with the second structure via a lateral shear force imparted by the tapered surface of the first structure and the corresponding tapered surface of the second structure.

13. The method of claim 12 wherein the first metal and the second metal are both Au.

14. A method for laterally aligning two components, the method comprising:
providing a first component;
forming on the first component a first structure, wherein the shape of the first structure is chosen from the group consisting of cones, truncated cones, pyramids, wedges, frustra and geometric objects whose cross-sectional areas are larger at a base of the geometric object than at a distil end of the geometric object, and a surface of the first structure is tapered,
providing a second component;
forming on the second component a second structure, wherein
    the shape of the second structure is complementary to the first structure with a corresponding tapered surface, and
disposing the first component on the second component such that the first structure mates with the second structure via a lateral shear force imparted by the tapered surface of the first structure and the corresponding tapered surface of the second structure.

15. An apparatus electrically connecting two integrated circuits, the apparatus comprising:
a first integrated circuit that includes a first electrical bond pad,
a first structure on the first electrical bond pad comprised of an electrically conductive material, the first structure having surface or sidewall that is tapered, and
a second integrated circuit that includes a second electrical bond pad,
a second structure on the second electrical bond pad comprising an electrically conductive material and having a shape that is complementary to, and mates with, the first structure with a corresponding tapered surface or sidewall, a portion of said corresponding tapered surface or sidewall of the second structure engaging the surface or sidewall of the first structure when the integrated circuit is disposed on the second integrated circuit such that the first structure is in a mating relationship with the second structure via a lateral shear force imparted by the tapered surface or sidewall of the first structure and the corresponding tapered surface or sidewall of the second structure.

16. The apparatus of claim 15 wherein the first metal and the second metal are both Au.

17. An apparatus laterally aligning two components, the apparatus comprising:
   a first component,
   a first structure formed on the first component, wherein a surface or sidewall of the first structure is tapered,
   a second component,
   a second structure formed on the second component with a corresponding tapered surface or sidewall, and
   the first component is disposed on the second component such that at least a portion of said corresponding tapered surface or sidewall of the second structure engages the tapered surface or sidewall of the first structure to effect lateral relative movement between the first component and the second component via a lateral shear force imparted by the tapered surface or sidewall of the first structure and the corresponding tapered surface or sidewall of the second structure.

18. The apparatus of claim 17 wherein a shape of the second structure formed on the second component is complementary to, and mates with, the first structure formed on the first component.

19. The apparatus of claim 17 wherein a shape of the first structure formed on the first component is selected from the group consisting of cones, truncated cones, pyramids, wedges and frustra.

20. The apparatus of claim 19 wherein said group also includes geometric objects whose cross-sectional areas are larger at a base of the geometric object than at a distil end of the geometric object.

* * * * *